United States Patent
Chuang et al.

(10) Patent No.: US 10,475,709 B1
(45) Date of Patent: Nov. 12, 2019

(54) SEMICONDUCTOR DEVICE AND METHOD FOR FABRICATING THE SAME

(71) Applicant: UNITED MICROELECTRONICS CORP., Hsin-Chu (TW)

(72) Inventors: Fu-Jung Chuang, Kaohsiung (TW); Ching-Ling Lin, Kaohsiung (TW); Po-Jen Chuang, Kaohsiung (TW); Yu-Ren Wang, Tainan (TW); Wen-An Liang, Tainan (TW); Chia-Ming Kuo, Kaohsiung (TW); Guan-Wei Huang, Tainan (TW); Yuan-Yu Chung, Tainan (TW); I-Ming Tseng, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/030,871

(22) Filed: Jul. 10, 2018

(30) Foreign Application Priority Data

Jun. 12, 2018 (TW) .............................. 107120159 A

(51) Int. Cl.
*H01L 21/00* (2006.01)
*H01L 21/8238* (2006.01)
*H01L 27/092* (2006.01)
*H01L 21/762* (2006.01)

(52) U.S. Cl.
CPC ............. *H01L 21/823878* (2013.01); *H01L 21/76224* (2013.01); *H01L 21/823821* (2013.01); *H01L 27/0924* (2013.01)

(58) Field of Classification Search
CPC ....... H01L 21/823878; H01L 21/76224; H01L 21/823821; H01L 27/0924
See application file for complete search history.

(56) References Cited

U.S. PATENT DOCUMENTS

| | | | |
|---|---|---|---|
| 9,805,989 B1* | 10/2017 | Adusumilli | H01L 21/823814 |
| 10,008,599 B1 | 6/2018 | Hsu | |
| 2016/0276429 A1 | 9/2016 | Tseng | |
| 2018/0138172 A1* | 5/2018 | Chen | H01L 27/0886 |
| 2018/0204840 A1* | 7/2018 | Peng | H01L 27/0924 |

* cited by examiner

Primary Examiner — Richard A Booth
(74) Attorney, Agent, or Firm — Winston Hsu

(57) ABSTRACT

A method for fabricating semiconductor device includes the steps of: providing a substrate having a first region and a second region; forming a first fin-shaped structure on the first region; removing part of the first fin-shaped structure to form a first trench; forming a dielectric layer in the first trench, wherein the dielectric layer comprises silicon oxycarbonitride (SiOCN); and planarizing the dielectric layer to form a first single diffusion break (SDB) structure.

10 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: providing a substrate having a first region and a second region; forming a first fin-shaped structure on the first region; removing part of the first fin-shaped structure to form a first trench; forming a dielectric layer in the first trench, wherein the dielectric layer comprises silicon oxycarbonitride (SiOCN); and planarizing the dielectric layer to form a first single diffusion break (SDB) structure.

According to another aspect of the present invention, a semiconductor device includes: a substrate having a first region and a second region; a first fin-shaped structure on the first region; and a first single diffusion break (SDB) structure in the first fin-shaped structure to divide the first fin-shaped structure into a first portion and a second portion. Preferably, the first SDB structure comprises silicon oxycarbonitride (SiOCN).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
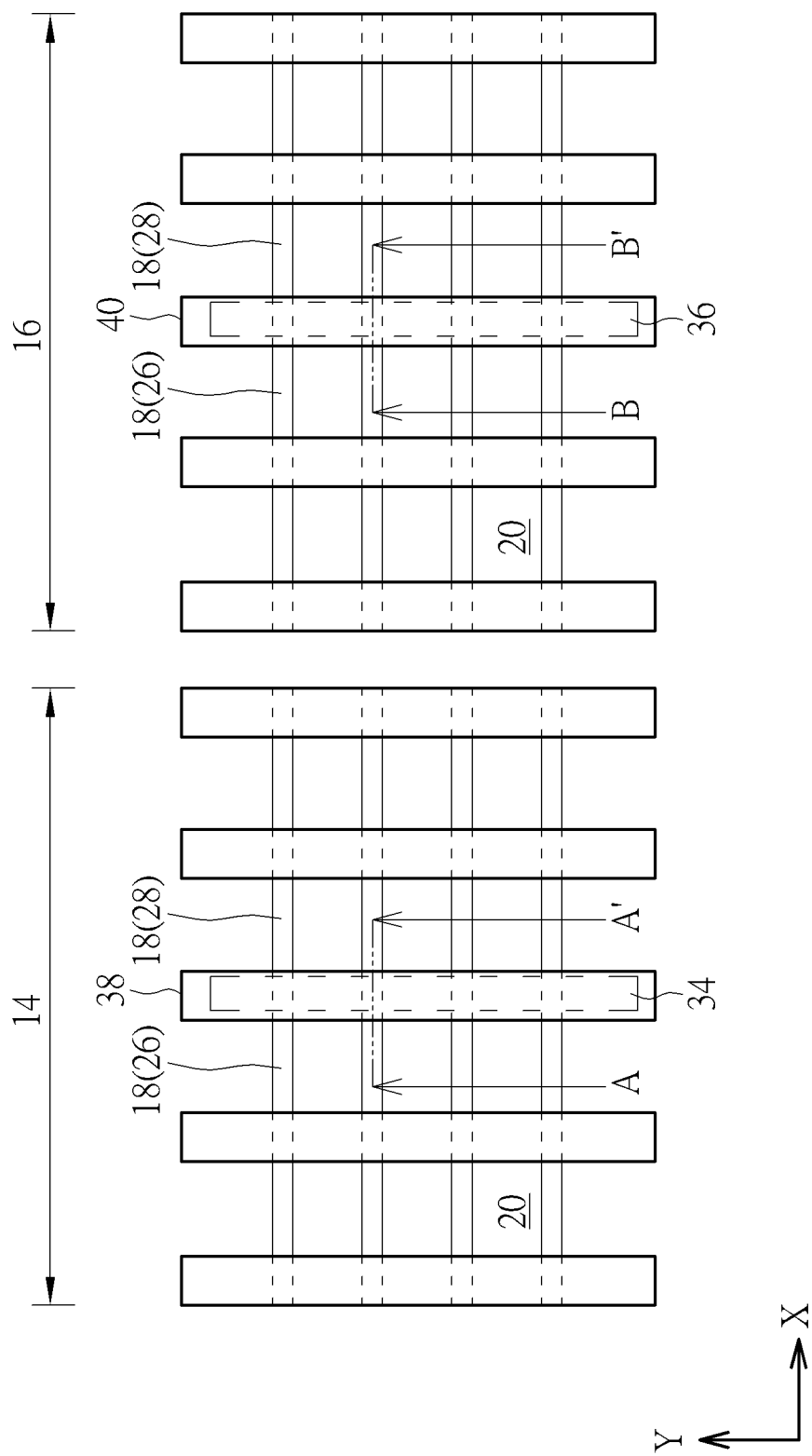
FIG. 1 is a top view illustrating a method for fabricating a semiconductor device according to an embodiment of the present invention.
Figure 2:
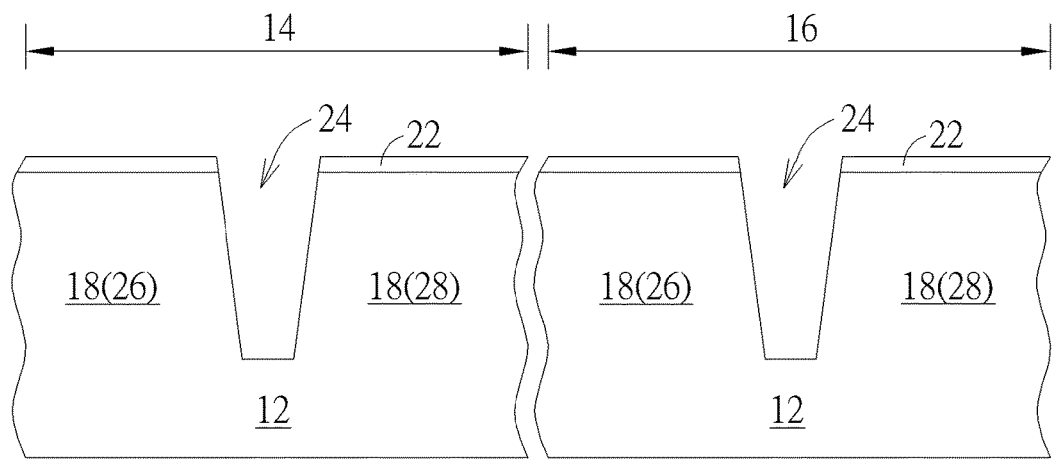
FIGS. 2-7 illustrate a method for fabricating a semiconductor device according to an embodiment of the present invention.

Referring to FIGS. 1-2, in which FIG. 1 is a top view illustrating a method for fabricating a semiconductor device according to an embodiment of the present invention, the left portion of FIG. 2 illustrates a cross-sectional view of FIG. 1 for fabricating the semiconductor device along the sectional line AA', and the right portion of FIG. 2 illustrates a cross-sectional view of FIG. 1 for fabricating the semiconductor device along the sectional line BB'. As shown in FIGS. 1-2, a substrate 12, such as a silicon substrate or silicon-on-insulator (SOI) substrate is first provided, a first region such as a NMOS region 14 and a second region such as a PMOS region 16 are defined on the substrate 12, and at least a fin-shaped structure 18 is formed on each of the NMOS region 14 and PMOS region 16. It should be noted that even though four fin-shaped structures 18 are disposed on each of the transistor regions in this embodiment, it would also be desirable to adjust the number of fin-shaped structures 18 depending on the demand of the product, which is also within the scope of the present invention.

Preferably, the fin-shaped structures 18 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structure are all within the scope of the present invention. It should be noted that after the fin-shaped structures 18 are formed, a liner 22 made of silicon oxide could be formed on the surface of the fin-shaped structures 18 on the NMOS region 14 and PMOS region 16.

Next, a shallow trench isolation (STI) 20 is formed around the fin-shaped structures 18. In this embodiment, the formation of the STI 20 could be accomplished by conducting a flowable chemical vapor deposition (FCVD) process to form a silicon oxide layer on the substrate 12 and covering the fin-shaped structures 18 entirely. Next, a chemical mechanical polishing (CMP) process along with an etching process are conducted to remove part of the silicon oxide layer so that the top surface of the remaining silicon oxide is slightly lower than the top surface of the fin-shaped structures 18 for forming the STI 20.

Next, as shown in FIG. 2, an etching process is conducted by using a patterned mask (not shown) as mask to remove part of the liner 22 and part of the fin-shaped structures 18 to form trenches 24, in which each of the trenches 24 preferably divides each of the fin-shaped structures 18 disposed on the NMOS region 14 and PMOS region 16 into two portions, including a portion 26 on the left side of the trench 24 and a portion 28 on the right side of the trench 24.

Figure 3:
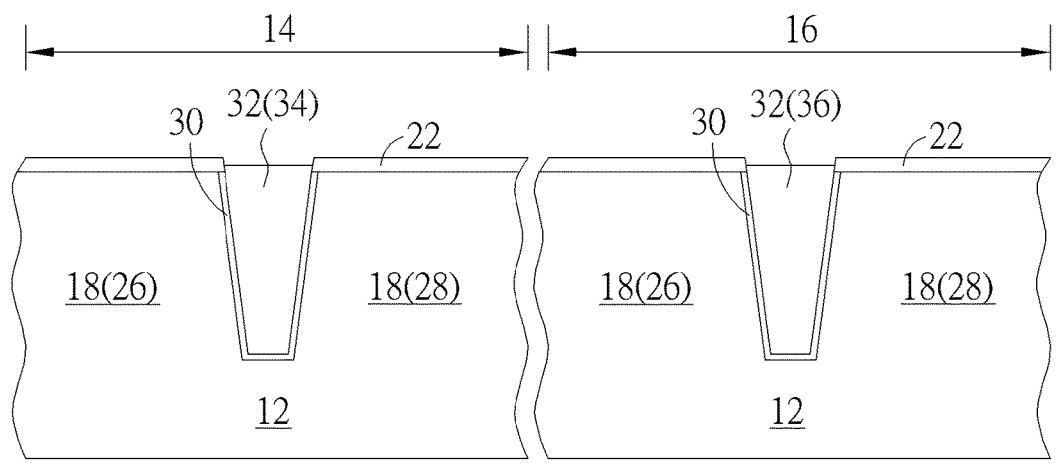

Next, as shown in FIG. 3, an oxidation process is conducted to form another liner 30 made of silicon oxide in the trenches 24 on the NMOS region 14 and PMOS region 16, in which the liner 30 is disposed on the bottom surface and two sidewalls of the trenches 24 and contacting the liner 22 directly. Next, a dielectric layer 32 is formed in the trenches 24 and filling the trenches 24 completely, and a planarizing process such as chemical mechanical polishing (CMP) process and/or etching process is conducted to remove part of the dielectric layer 32 so that the top surface of the remaining dielectric layer 32 is even with or slightly higher than the top surface of the fin-shaped structures 18. This forms SDB structures 34, 36 on the NMOS region 14 and PMOS region 16 respectively.

As shown in FIG. 1, each of the fin-shaped structures 18 on the NMOS region 14 and PMOS region 16 are disposed extending along a first direction (such as X-direction) while the SDB structures 34, are disposed extending along a second direction (such as Y-direction), in which the first direction is orthogonal to the second direction.

It should be noted that the dielectric layer 32 and the liner 30 in this embodiment are preferably made of different materials, in which the liner 30 is preferably made of silicon oxide and the dielectric layer 32 is made of silicon oxycarbonitride (SiOCN). Specifically, the SDB structures 34, 36 made of SiOCN in this embodiment are preferably structures having low stress, in which the concentration proportion of oxygen within SiOCN is preferably between 30% to 60% and the stress of each of the SDB structures 34, 36 is between 100 MPa to −500 MPa or most preferably at around 0 MPa. In contrast to the conventional SDB structures made of dielectric material such as silicon oxide or silicon nitride, the SDB structures of this embodiment made of low stress material such as SiOCN could increase the performance of on/off current in each of the transistors thereby boost the performance of the device.

Figure 4:
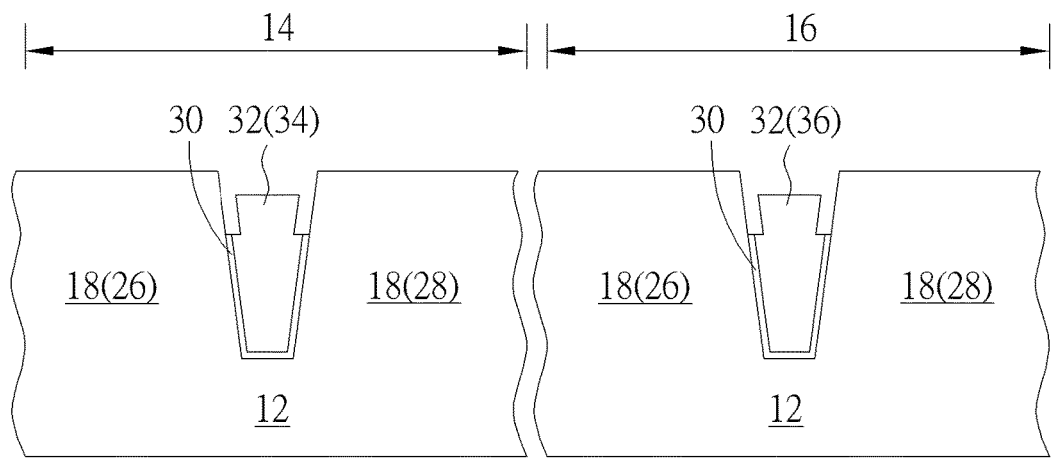

Next, as shown in FIG. 4, an ion implantation process could be conducted to form deep wells or well regions in the fin-shaped structures 18 on the NMOS region 14 and PMOS region 16, and a clean process could be conducted by using diluted hydrofluoric acid (dHF) to remove the liner 22 on the surface of the fin-shaped structures 18 completely, part of the liner 30 on sidewalls of the trenches 24, and even part of the SDB structures 34, 36. This exposes the surface of the fin-shaped structures 18 and the top surfaces of the remaining liner 30 and the SDB structures 34, 36 are slightly lower than the top surface of the fin-shaped structures 18 while the top surface of the SDB structures 34 36 is also slightly higher than the top surface of the remaining liner 30.

Figure 5:
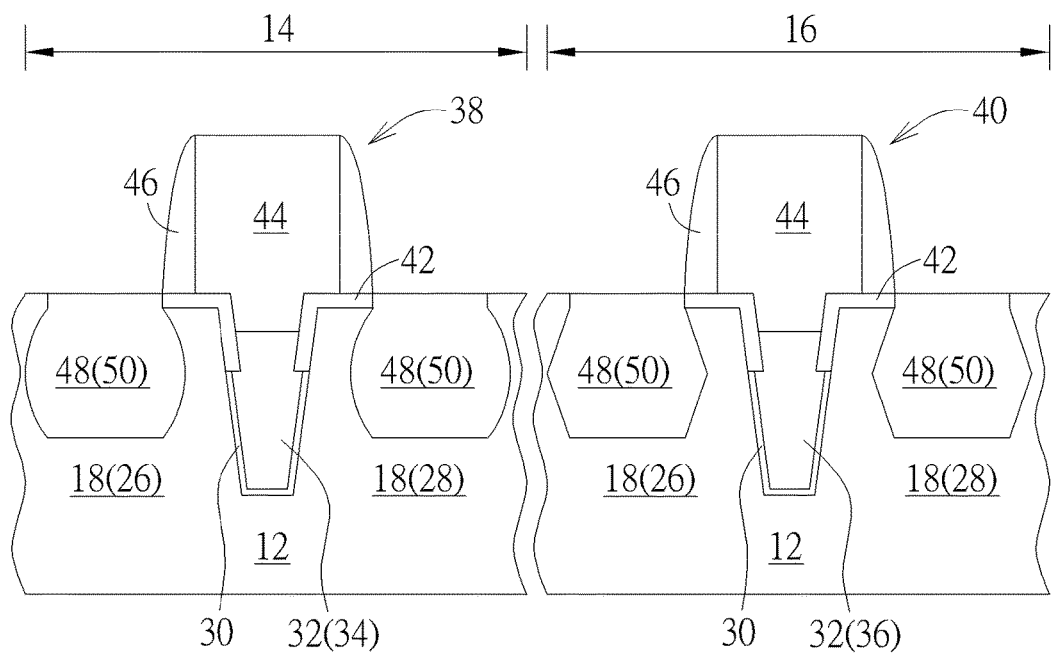

Next, as shown in FIG. 5, at least a gate structure such as gate structures 38, 40 or dummy gates are formed on the fin-shaped structures 18 on the NMOS region 14 and PMOS region 16. In this embodiment, the formation of the first gate structure 38, 40 could be accomplished by a gate first process, a high-k first approach from gate last process, or a high-k last approach from gate last process. Since this embodiment pertains to a high-k last approach, a gate dielectric layer 42 or interfacial layer, a gate material layer 44 made of polysilicon, and a selective hard mask could be formed sequentially on the substrate 12 or fin-shaped structures 18, and a photo-etching process is then conducted by using a patterned resist (not shown) as mask to remove part of the gate material layer 44 and part of the gate dielectric layer 42 through single or multiple etching processes. After stripping the patterned resist, gate structures 38, 40 each composed of a patterned gate dielectric layer 42 and a patterned material layer 44 are formed on the fin-shaped structures 18.

Next, at least a spacer 46 is formed on sidewalls of the each of the gate structures 38, 40, a source/drain region 48 and/or epitaxial layer 50 is formed in the fin-shaped structure 18 adjacent to two sides of the spacer 46, and selective silicide layers (not shown) could be formed on the surface of the source/drain regions 48. In this embodiment, each of the spacers 46 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 48 and epitaxial layers 50 could include different dopants and/or different materials depending on the conductive type of the device being fabricated. For instance, the source/drain region 48 on the NMOS region 14 could include n-type dopants and the epitaxial layer 50 on the same region could include silicon phosphide (SiP) while the source/drain region 48 on the PMOS region 16 could include p-type dopants and the epitaxial layer 50 on the same region could include silicon germanium (SiGe).

Figure 6:
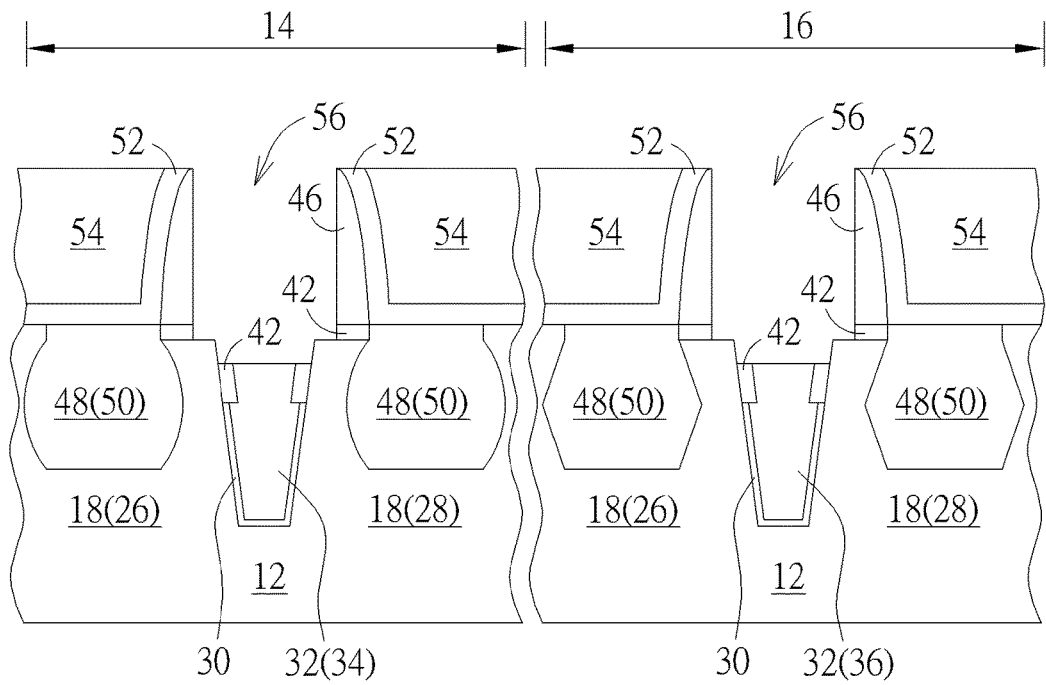

Next, as shown in FIG. 6, a contact etch stop layer (CESL) 52 is formed on the surface of the fin-shaped structures 18 and covering the gate structures 38, 40, and an interlayer dielectric (ILD) layer 54 is formed on the CESL 52. Next, a planarizing process such as CMP is conducted to remove part of the ILD layer 54 and part of the CESL 52 for exposing the gate material layer 44 made of polysilicon, in which the top surface of the gate material layer 44 is even with the top surface of the ILD layer 54.

Next, a replacement metal gate (RMG) process is conducted to transform the gate structures 38, 40 into metal gates 58, 60. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 44 and even gate dielectric layer 42 from the gate structures 38, 40 for forming recesses 56 in the ILD layer 54.

Figure 7:
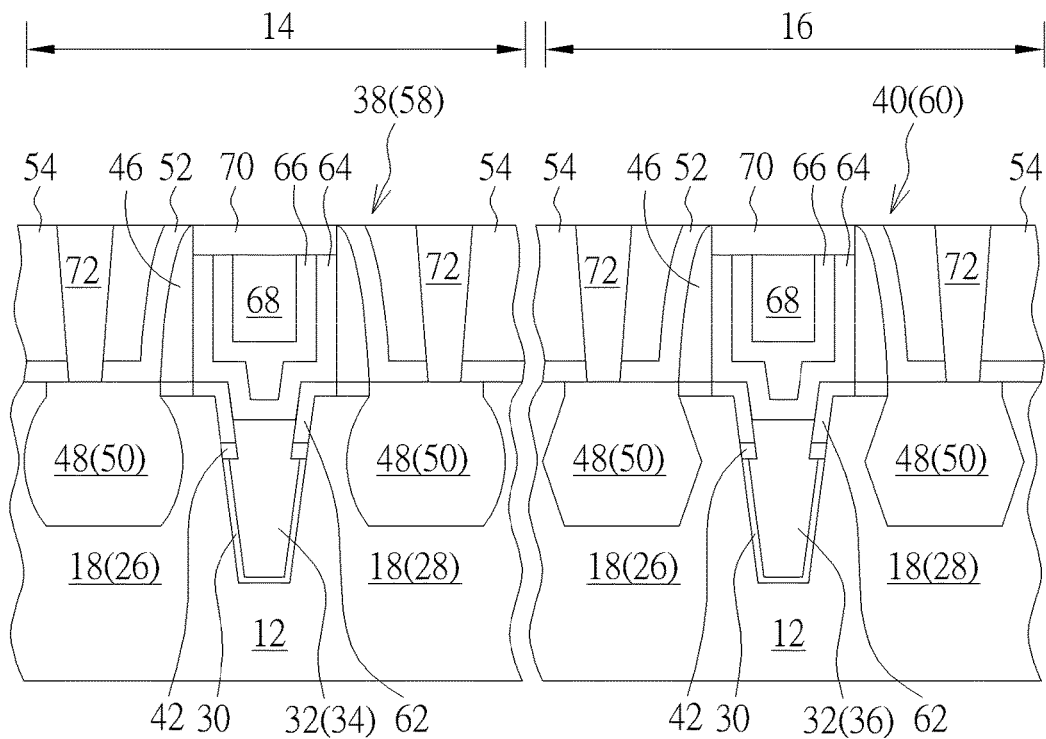

Next, as shown in FIG. 7, a selective interfacial layer or gate dielectric layer 62, a high-k dielectric layer 64, a work function metal layer 66, and a low resistance metal layer 68 are formed in the recesses 56, and a planarizing process such as CMP is conducted to remove part of low resistance metal layer 68, part of work function metal layer 66, and part of high-k dielectric layer 64 to form metal gates 58, 60. Next, part of the low resistance metal layer 68, part of the work function metal layer 66, and part of the high-k dielectric layer 64 are removed to form a recess (not shown) on each of the transistor region, and a hard mask 70 made of dielectric material including but not limited to for example silicon nitride is deposited into the recesses so that the top surfaces of the hard mask 70 and ILD layer 54 are coplanar. In this embodiment, each of the gate structures or metal gates 58, 60 fabricated through high-k last process of a gate last process preferably includes an interfacial layer or gate dielectric layer 62, a U-shaped high-k dielectric layer 64, a U-shaped work function metal layer 66, and a low resistance metal layer 68.

In this embodiment, the high-k dielectric layer 64 is preferably selected from dielectric materials having dielectric constant (k value) larger than 4. For instance, the high-k dielectric layer 64 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 66 is formed for tuning the work function of the metal gate in accordance with the conductivity of the device. For an NMOS transistor, the work function metal layer 66 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 66 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 66 and the low resistance metal layer 68, in which the material of the barrier layer may include titanium (Ti), titanium nitride (TiN), tantalum (Ta) or tantalum nitride (TaN). Furthermore, the material of the low-resistance metal layer 68 may include copper (Cu), aluminum (Al), titanium aluminum (TiAl), cobalt tungsten phosphide (CoWP) or any combination thereof.

Next, a pattern transfer process is conducted by using a patterned mask (not shown) as mask to remove part of the ILD layer 54 and part of the CESL 52 for forming contact holes (not shown) exposing the source/drain regions 48 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 72 electrically connecting the source/drain regions 48. This completes the fabrication of a semiconductor device according to a preferred embodiment of the present invention.

It should be noted that even though SDB structures 34, 36 are formed on the NMOS region 14 and PMOS region 16 at the same time in the aforementioned embodiment, it would also be desirable to follow the aforementioned process to form SDB structure only on the NMOS region 14 or the PMOS region 16 and then conduct gate structure formation and RMG process afterwards, which is also within the scope of the present invention.

Overall, the present invention first forms fin-shaped structures on the NMOS region and/or PMOS region, divides each of the fin-shaped structures into two portions by forming at least a trench in the fin-shaped structures, and then deposits a dielectric material into the trenches on both transistors at the same time to form SDB structures. According to a preferred embodiment of the present invention, the SDB structures formed on the NMOS region and PMOS region are preferably made of SiOCN, in which the proportion of oxygen concentration in SiOCN is preferably between 30% to 60% and the stress of each of the SDB structures 34, 36 is preferably between 100 MPa to −500 MPa. In contrast to the conventional SDB structures made of dielectric material such as silicon oxide or silicon nitride, the SDB structures of the present invention made of low stress material such as SiOCN could increase the performance of on/off current in each of the transistors and boost the performance of the device substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a first region and a second region;
   a first fin-shaped structure on the first region; and
   a first single diffusion break (SDB) structure in the first fin-shaped structure to divide the first fin-shaped structure into a first portion and a second portion, wherein the first SDB structure comprises silicon oxycarbonitride (SiOCN).

2. The semiconductor device of claim 1, further comprising:
   a second fin-shaped structure on the second region; and
   a second SDB structure in the second fin-shaped structure to divide the second fin-shaped structure into a third portion and a fourth portion, wherein the second SDB structure comprises SiOCN.

3. The semiconductor device of claim 2, further comprising a liner between the first SDB structure and the first fin-shaped structure.

4. The semiconductor device of claim 3, wherein the liner and the first SDB structure comprise different materials.

5. The semiconductor device of claim 3, wherein the liner comprises silicon oxide.

6. The semiconductor device of claim 5, further comprising:
   a first gate structure on the first SDB structure and the first fin-shaped structure;
   a second gate structure on the second SDB structure and the second fin-shaped structure;
   a first source/drain region adjacent to the first gate structure; and
   a second source/drain region adjacent to the second gate structure.

7. The semiconductor device of claim 6, wherein each of the first fin-shaped structure and the second fin-shaped structure is disposed extending along a first direction and the first SDB structure and the second SDB structure are disposed extending along a second direction.

8. The semiconductor device of claim 7, wherein the first direction is orthogonal to the second direction.

9. The semiconductor device of claim 1, wherein a concentration proportion of oxygen in SiOCN is between 30% to 60%.

10. The semiconductor device of claim 1, wherein a stress of the first SDB structure is between 100 MPa to −500 MPa.

\* \* \* \* \*